(12) United States Patent
Wathanawasam et al.

(10) Patent No.: US 7,671,478 B2
(45) Date of Patent: Mar. 2, 2010

(54) LOW HEIGHT VERTICAL SENSOR PACKAGING

(75) Inventors: Lakshman S. Wathanawasam, Maple Grove, MN (US); Michael J. Bohlinger, Minnetonka, MN (US); Tamara K. Bratland, Plymouth, MN (US); Hong Wan, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 735 days.

(21) Appl. No.: 11/219,495

(22) Filed: Sep. 2, 2005

(65) Prior Publication Data

US 2007/0052077 A1 Mar. 8, 2007

(51) Int. Cl.
*H01L 29/40* (2006.01)

(52) U.S. Cl. .................. 257/786; 257/678; 257/784; 257/E23.151; 257/E23.024

(58) Field of Classification Search ................ 257/108, 257/786, E23.151
See application file for complete search history.

(56) References Cited

U.S. PATENT DOCUMENTS

| | | | | |
|---|---|---|---|---|
| 5,453,691 | A * | 9/1995 | David et al. ................ | 324/248 |
| 5,600,071 | A | 2/1997 | Sooriakumar et al. ........ | 73/721 |
| 5,635,649 | A | 6/1997 | Tobita et al. ................ | 73/717 |
| 5,763,943 | A | 6/1998 | Baker et al. ................. | 257/686 |
| 5,831,162 | A | 11/1998 | Sparks et al. ............ | 73/504.12 |
| 6,137,708 | A | 10/2000 | Lin et al. ..................... | 365/51 |
| 6,212,060 | B1 | 4/2001 | Liu .......................... | 361/329 |
| 6,244,121 | B1 | 6/2001 | Hunter ..................... | 73/865.9 |
| 6,305,223 | B1 | 10/2001 | Matsumoto et al. ...... | 73/514.32 |
| 6,388,887 | B1 | 5/2002 | Matsumoto et al. ........ | 361/760 |
| 6,420,651 | B1 | 7/2002 | Barrow .................... | 174/52.2 |
| 6,463,804 | B2 | 10/2002 | Matsumoto et al. ...... | 73/514.32 |
| 2001/0023615 | A1 | 9/2001 | Matsumoto et al. ...... | 73/514.32 |
| 2002/0029637 | A1 | 3/2002 | Matsumoto et al. ...... | 73/504.01 |

(Continued)

FOREIGN PATENT DOCUMENTS

EP 0 584 874 A2 3/1994

(Continued)

OTHER PUBLICATIONS

English translation of Furuhata reference (JP 05-275605).*

(Continued)

*Primary Examiner*—Thao X Le
*Assistant Examiner*—Ajay K Arora
(74) *Attorney, Agent, or Firm*—Fogg & Powers LLC (57) ABSTRACT

A system and method for packaging a magnetic sensor is described. A sensor die is constructed such that connection pads are situated on two opposing sides of the die in two vertical arrays. Bonding wires connect the connection pads on the sensor die to wire bond pads on a substrate. Alternatively, the connection pads are connected to solderable chip pads on the substrate using flip chip bonding. Traces and vias are used to connect the wire bond pads or the solderable chip pads to sensor package pads. The sensor package pads are located on a single side of a sensor package for mounting on a next assembly. The next assembly has a land pattern that includes at least one leveling pad for positioning the sensor die perpendicular to the next assembly while being mounted and a single row of pads for making connections to the sensor package.

13 Claims, 6 Drawing Sheets

U.S. PATENT DOCUMENTS

| | | | |
|---|---|---|---|
| 2002/0030975 A1 | 3/2002 | Moon | 361/749 |
| 2002/0125552 A1 | 9/2002 | Li et al. | 257/678 |
| 2003/0057541 A1 | 3/2003 | Betori | 257/690 |
| 2003/0160321 A1 | 8/2003 | Cloud et al. | 257/724 |
| 2004/0067606 A1 | 4/2004 | Fehr et al. | 438/109 |
| 2004/0084211 A1* | 5/2004 | Fayfield | 174/261 |
| 2004/0201088 A1 | 10/2004 | Kim et al. | 257/686 |
| 2004/0212053 A1* | 10/2004 | Koh et al. | 257/676 |
| 2005/0122100 A1 | 6/2005 | Wan et al. | 324/247 |
| 2005/0258520 A1 | 11/2005 | Dolan | 257/670 |

FOREIGN PATENT DOCUMENTS

| | | | |
|---|---|---|---|
| JP | 05-275605 | * | 10/1993 |
| JP | 2004327903 | | 11/2004 |

OTHER PUBLICATIONS

European Search Report for 06119963.44—2216 dated Dec. 29, 2006.

"Magnetic Sensors Press Room", http://www.ssec.honeywell.com/magnetic/new/20050401.html; Apr. 1, 2005.

"1-Axis magnetic Sensor HMC1041Z" Honeywell (www.honeywell.com); Apr. 2005.

"1, 2 and 3-Axis Magnetic Sensors", Honeywell, Oct. 2003.

"Three-Axis Magnetoresistive Sensor HMC10263", Honeywell, Feb. 2000.

* cited by examiner

Fig. 4a
Front View

Fig. 4b
Bottom View

Fig. 4c
Back View

LOW HEIGHT VERTICAL SENSOR PACKAGING

FIELD

The present invention relates generally to magnetic sensors, and more particularly, relates to packaging for a magnetic sensor.

BACKGROUND

A magnetic sensor designed to sense a magnetic field in three orthogonal directions would typically require a sensor axis mounted perpendicular to a printed wire board (PWB), a printed circuit board (PCB), or other assembly used for mounting electronic components. However, this mounting arrangement causes the magnetic sensor to have a height that is usually greater than other devices mounted on the PCB. As a result, the height of the magnetic sensor may be a determining factor of the height of any electronic device that includes the sensor.

For example, some cellular telephones have magnetic sensors. Over time cellular telephones have decreased in size due to consumer demand for smaller electronic devices. The demand for even smaller cellular telephones makes the height of the magnetic sensor a potential design issue. The height of the magnetic sensor may become a design issue in other applications as well. Further, the height of the magnetic sensor may limit the placement of the sensor on a PCB.

Figure 2:
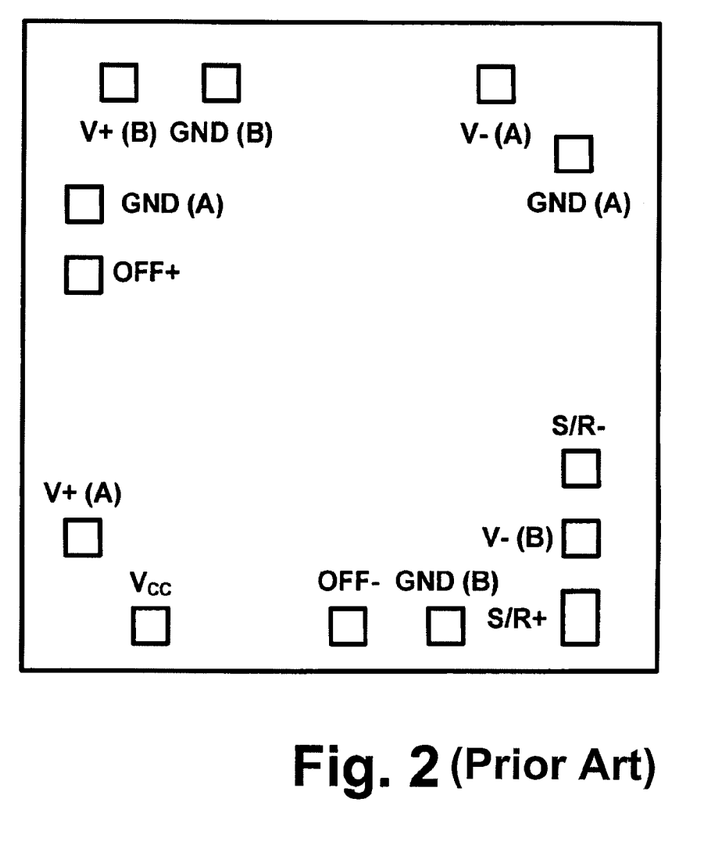
FIG. 2 is an example of a pad layout for a magnetic sensor die.

Currently, the typical height of a magnetic sensor with respect to the PCB is approximately 5 mm. The input and output signals of the magnetic sensor are connectable via connection pads that are typically located in various locations around the magnetic sensor die or grouped by function. For example, a magnetic sensor may include connection pads for power (Vcc), ground (GND), an offset strap (OFF+, OFF−), a set/reset strap (S/R+, S/R−), and differential voltage output signals (OUT+, OUT−). The offset strap and the set/reset strap features of the magnetic sensor allow for incident field adjustment and magnetic domain alignment. FIG. 2 depicts one example of a typical pad layout for a magnetic sensor die.

It would be beneficial to package a magnetic sensor in a manner that minimizes the height of the sensor when mounted perpendicular to a PCB. However, any packaging method used to reduce height should also be cost effective.

SUMMARY

A system and method for packaging a magnetic sensor is described. The sensor package includes a sensor die mounted on a substrate. The sensor die mounted on the substrate is enclosed by a housing. The housing is typically constructed by injecting or transferring a material into a mold. For example, the material may be a plastic, an elastomer, or an epoxy. However, other construction methods and materials may be used. The housing material may completely encapsulate the sensor die and the substrate.

The sensor die has connection pads located in two vertical arrays on two opposing sides of the sensor die. The connection pads are not located in the center of the sensor die. The connection pads are connected to the substrate at a plurality of contact points. In one example, bonding wires connect the connection pads on the sensor die to wire bond pads on the substrate. The wire bond pads are located on either side of the sensor die and positioned to be substantially parallel to the connection pads. Preferably, each wire bond pad is substantially aligned with the connection pad in which it is connected via the bonding wire. Alternatively, the connection pads on the sensor die are connected to solderable pads on the substrate using flip chip bonding.

This arrangement minimizes the package height of the die. For example, the sensor height when mounted on a PCB may be reduced from a typical package height of approximately 5 mm to approximately 1 mm. Thus, the magnetic sensor may be used in applications requiring a low height sensor package. Further, this low profile sensor package does not constrain the sensor's placement on a PCB as a taller package would.

The sensor package may be mounted onto a next assembly, such as a PCB. The sensor package may have connections on just one side of the sensor package. The next assembly may include a land pattern that includes at least one leveling pad and a single row of pads for making electrical and mechanical connections to the next assembly. The at least one leveling pad is used to hold the magnetic sensor perpendicular to the next assembly as the sensor package is mounted on the next assembly. The mounting may be accomplished via a single reflow step, which may be automated.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
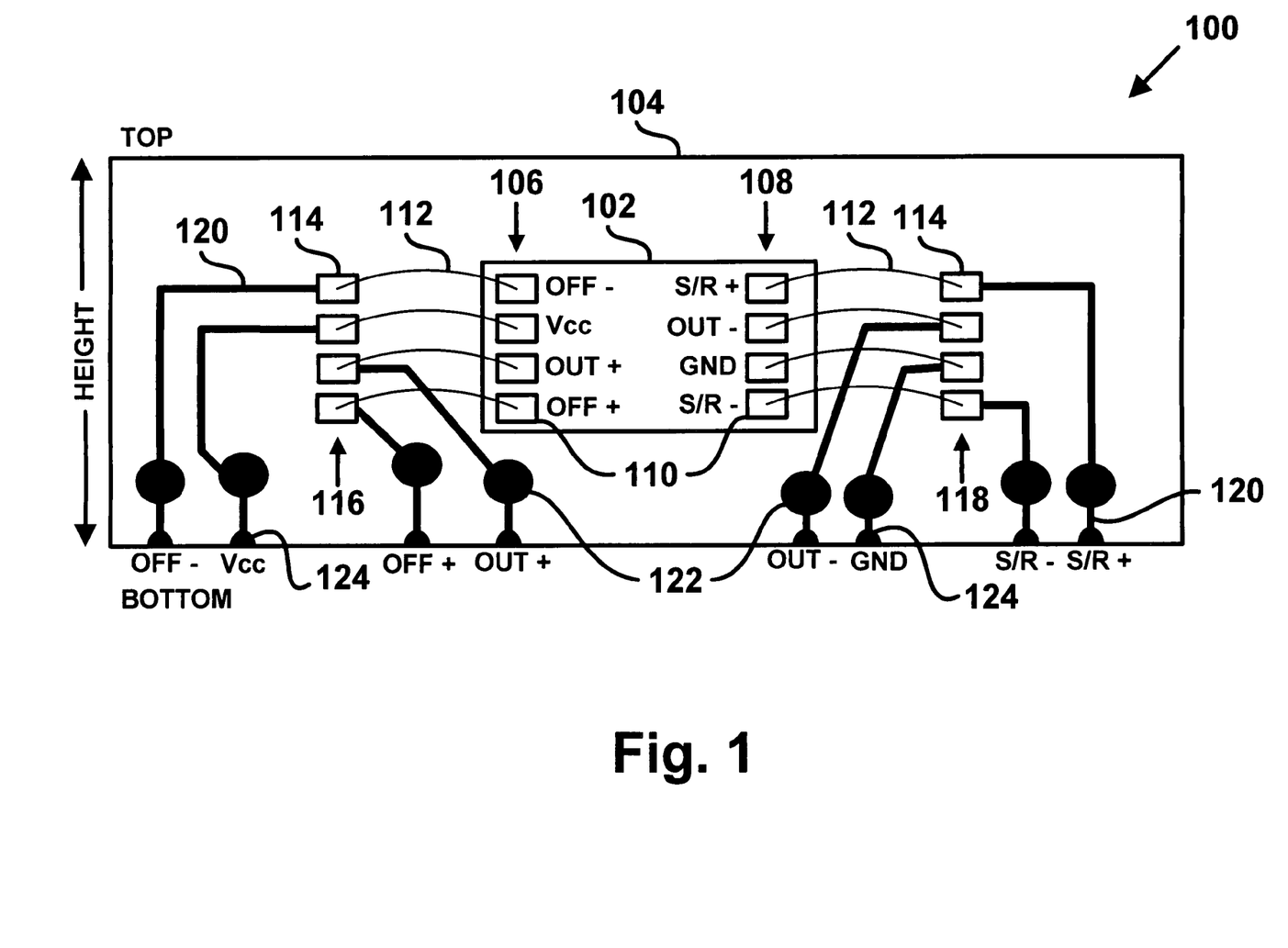
FIG. 1 is a side view of a sensor package, according to an example.

FIG. 1 shows a side view of a sensor package 100 without a housing. The housing is depicted in FIG. 4. The sensor package 100 includes a sensor die 102 mounted on a substrate 104. The sensor die 102 may be a magnetic sensor or any other sensor that senses a component of a vector quantity. The bottom of the sensor package 100 may be mounted on a PWB, a PCB, or other assembly used for mounting electronic components. The height of the sensor package 100 may be a critical factor in some electronic designs.

To minimize the height of the sensor package 100, the sensor die 102 may have connection pads 110 located in two vertical arrays 106, 108 on opposing sides of the sensor die 102. The two vertical arrays 106, 108 are located on the two opposing sides of the sensor die 102 that are substantially parallel to the sides of the substrate 104 that define the height of the packaging system 100. The connection pads 110 may also be located in more than two vertical arrays.

In this example, the first vertical array 106 includes four connection pads 110 (i.e., OFF−, Vcc, OUT+, OFF+) and the second vertical array 108 includes four connection pads 110 (i.e., S/R+, OUT−, GND, and S/R−). However, the number of connection pads 110 in the vertical arrays 106, 108 may vary. For example, the sensor die 102 may include more or less than eight connection pads 110, which would be positioned into the two vertical arrays 106, 108.

As seen in FIG. 1, connection pads 110 are not located in the center of the sensor die 102, or at the top or bottom of the sensor die 102 unless located in the two vertical arrays 106, 108. The first and second vertical arrays 106, 108 typically contain the same number of connection pads 110; however, this is not necessary. While FIG. 1 depicts the two vertical arrays 106, 108 as including connection pads 110 of identical shape and size, this is also not necessary. Further, the first and second vertical arrays 106, 108 do not need to be in perfect alignment. For example, the distance of a connection pad 110 from a side edge of the sensor die 102 may be variable within the first and second vertical arrays 106, 108.

The preferred die design for a vertical package has two or more vertical arrays of connection pads 110 that do not extend in a vertical direction any more than an active region of the die extends in the vertical direction (i.e., the connection pads are vertically confined within the active region of the die). By limiting the dimensions of the connection pads so that they do not extend beyond the active region of the die, the package height may be minimized.

Bonding wire 112 may be used to connect the connection pads 110 located in the two vertical arrays 106, 108 on the sensor die 102 to wire bond pads 114 on the substrate 104. The bonding wire 112 may be aluminum, gold, or any other appropriate wire bonding material. Wire bonding is a low cost, high volume manufacturing process commonly used in electronic packaging. Wire bonding technology includes any method of making an electrical connection between a die and a substrate, including the use of wires and ribbons.

The wire bond pads 114 are positioned on the substrate 104 in two vertical arrays 116, 118. The first vertical array 116 of wire bond pads 114 is located on a portion of the substrate 104 adjacent to the side of the sensor die 102 containing the first vertical array 106 of connection pads 110. The second vertical array 118 of wire bond pads 114 is located on a portion of the substrate 104 adjacent to the side of the sensor die 102 containing the second vertical array 108 of connection pads 110.

Typically, the number of wire bond pads 114 is the same as the number of connection pads 110; however, this is not necessary. For example, a sensor die 102 having two connection pads 110 for the same signal (e.g., power or ground) may use the same wire bond pad 114. While FIG. 1 depicts the wire bond pads 114 as having an identical shape and size, this is also not necessary. Further, the vertical arrays 116, 118 of wire bond pads 114 do not need to be in perfect alignment. For example, the distance of a wire bond pad 114 from a side edge of the sensor die 102 may be variable within the vertical arrays 116, 118.

The wire bond pads 114 are located on the substrate 104 to be substantially parallel to corresponding connection pads 110. Preferably the wire bond pads 114 are located on the substrate 104 to be substantially aligned with the connection pads 110 on the sensor die 102. However, perfect alignment is not necessary.

Figure 3:
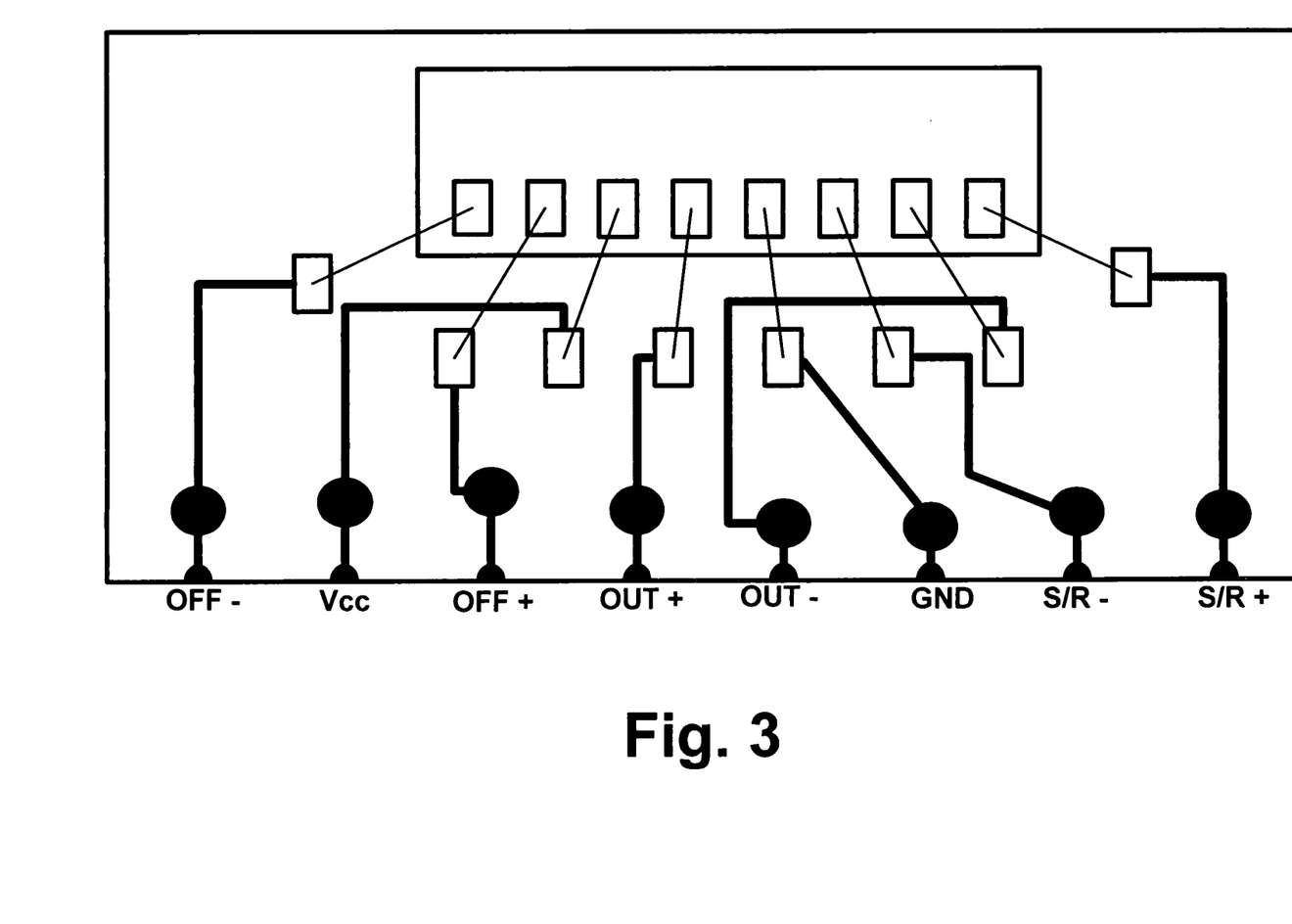
FIG. 3 is a side view of a sensor package in which wire bond pads are located at a bottom of a sensor package.

By positioning the wire bond pads 114 on either side of the sensor die 102, the wire bond pads 114 do not consume space on the substrate 104 below or above the sensor die 102, which minimizes the sensor package 100 height. For example, FIG. 3 depicts an arrangement in which wire bond pads are located below a sensor die. This arrangement adds approximately 1 mm to the height of a sensor package.

The wire bond pads 114 are then connected by traces 120 to vias 122. The vias 122 are connected by traces 120 to sensor package pads 124. The vias 122 and the sensor package pads 124 allow connections to input and output signals of the sensor die 102. Additionally, the sensor package pads 124 provide external connections to the sensor package 100. The location of the traces 120, the vias 122, and the sensor package pads 124 in FIG. 1 is provided as an example. The location of the traces 120, the vias 122, and the sensor package pads 124 can vary based on design requirements. Preferably, the sensor package pads 124 are located on a single side of the sensor package 100 as depicted in FIG. 4.

Alternatively, flip chip bonding may be used to connect the two vertical arrays 106, 108 to pads on the substrate 104. Flip chip technology encompasses a wide variety of techniques of attaching an active surface of a chip, including the use of solder bumps, gold bumps, adhesive bumps, and plastic nickel spheres. In this example, solderable chip pads are located on the substrate 104. The solderable chip pads are positioned to align with the position of the connection pads 110 in the two vertical arrays 106, 108. The two vertical arrays 106, 108 are connected to the solderable chip pads using solder bumps or other appropriate material.

The solderable chip pads are then connected by traces 120 to vias 122. The vias 122 are connected by traces 120 to sensor package pads 124. The vias 122 and the sensor package pads 124 allow connections to input and output signals of the sensor die 102. Additionally, the sensor package pads 124 provide external connections to the sensor package 100.

By constructing the sensor die 102 to have its connection pads 110 situated in two opposing sides in two vertical arrays 106, 108, the height of the sensor die 102 is reduced. For example, the height of the sensor die 102 may be reduced from a typical package height of 5 mm to approximately 1 mm. This package height reduction may be obtained due to eliminating the need for wire bonding above and below the sensor die 102. Additionally, the sensor package 100 can be manufactured in a cost effective manner due to the use of wire bonding and flip chip bonding, which are high volume and standard assembly processes.

Figure 4A:
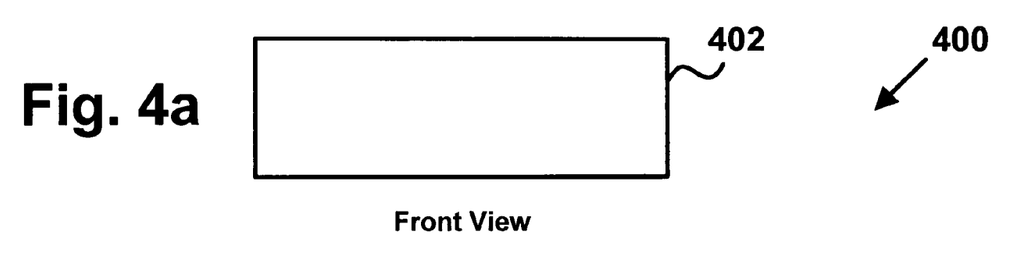
FIG. 4 is a package drawing for the sensor package depicted in FIG. 1, according to an example.
Figure 4B:
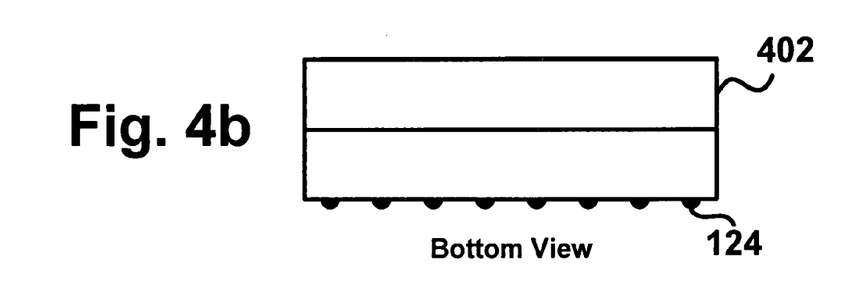
Figure 4C:
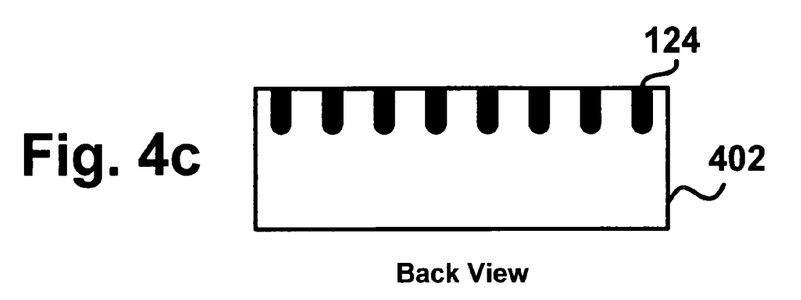

FIG. 4 is a package drawing 400 for the sensor package 100 depicted in FIG. 1. FIG. 4a depicts a front view of the sensor package 100, FIG. 4b depicts a bottom view of the sensor package 100, and FIG. 4c depicts a back view of the sensor package 100. In this non-limiting example, the package drawing 400 depicts an eight-pin leadless plastic chip carrier (LPCC) package. Other package types and number of pins may also be used.

FIG. 4 depicts the housing 402 that encloses the sensor die 102 connected to the substrate 104 as described with respect to FIG. 1. The housing 400 is typically constructed by injecting or transferring a material into a mold. For example, the material may be a plastic, an elastomer, or an epoxy. However, other construction methods and materials may also be used. The housing material may completely encapsulate the sensor die 102 and the substrate 104.

As seen in FIG. 4, the sensor package pads 124 are located on just one side of the sensor package 100. In this example, the sensor package pads 124 are located only on the back side of the sensor package 100. The sensor package 100 may be mounted to a next assembly, such as a PWB or PCB, using a solder reflow process. A single reflow step may be used to mount the sensor package 100 onto the next assembly. The solder reflow process may be automated, which may reduce processing costs. Moreover, a land pattern may be used on the next assembly so that the sensor package 100 is properly aligned when being mounted on the next assembly.

Figure 5:
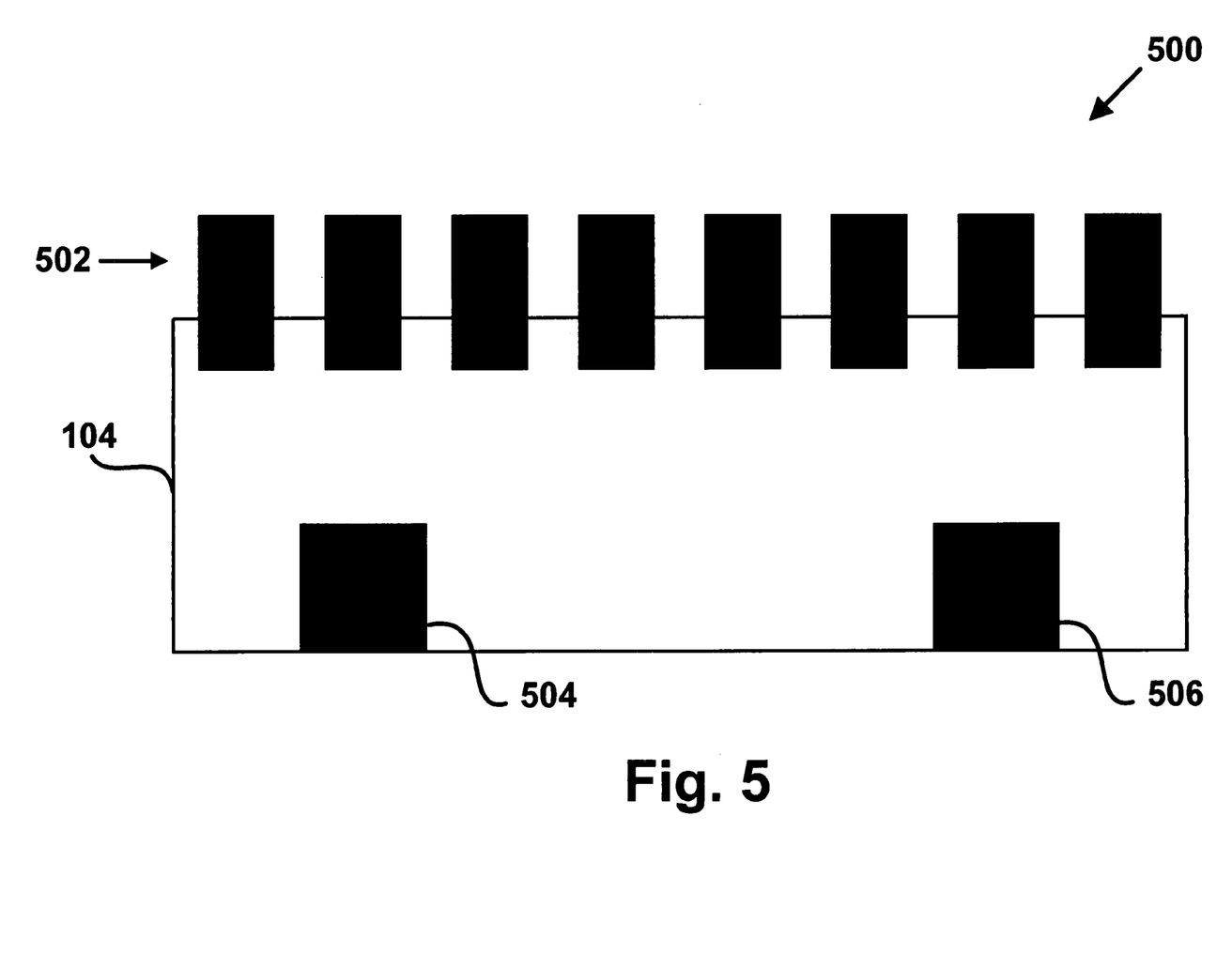
FIG. 5 is a land pattern for use in mounting the sensor package depicted in FIG. 1, according to an example.

FIG. 5 is a land pattern 500 for mounting the sensor package 100 on a next assembly, such as a PWB or PCB. A land pattern is a geometric contact shape provided on a surface for electrical and mechanical interface of surface-mounted devices. If the sensor package 100 will be mounted using surface mount technology, the land pattern 500 may be used to mount the sensor package 100 on the next assembly. For example, if the sensor package 100 is to be mounted on a PCB, the land pattern 500 may be provided on the PCB.

The land pattern 500 includes a single row of pads 502 for making electrical and/or mechanical connections to the sensor package 100. Each of the pads 502 may have a dimension of approximately 0.60 mm by 0.30 mm. However, the pads 502 may have other dimensions and shapes. The pads 502 may be placed approximately 0.20 mm apart. However, other spacing designs may be used, including irregular spacing. The land pattern 500 may be formed on the next assembly using a surface finish. The surface finish may be hot air solder leveling (HASL), organic solderability preservative (OSP), electroless nickel immersion gold (ENIG), or any other suitable surface finish.

The land pattern 500 also includes two leveling pads 504, 506 having the same surface finish as the row of pads 502. The leveling pads 504, 506 may be used to position the sensor package 100 square to the PCB or other assembly during mounting of the sensor package to the next assembly. As a result, the sensor package 100 may be mounted in a manner to keep the sensor's axis perpendicular to the PCB. The leveling pads 504, 506 may have a dimension of approximately 0.5 mm by 0.5 mm. However, other sizes and shapes may be used for the leveling pads 504, 506. The leveling pads 504, 506 do not need solder paste as the leveling pads 504, 506 are not used for making electrical contact. While FIG. 5 depicts two leveling pads 504, 506, the land pattern 500 may include more or less than two leveling pads. For example, the land pattern 500 may include a single leveling pad as depicted in FIG. 6.

Figure 6:
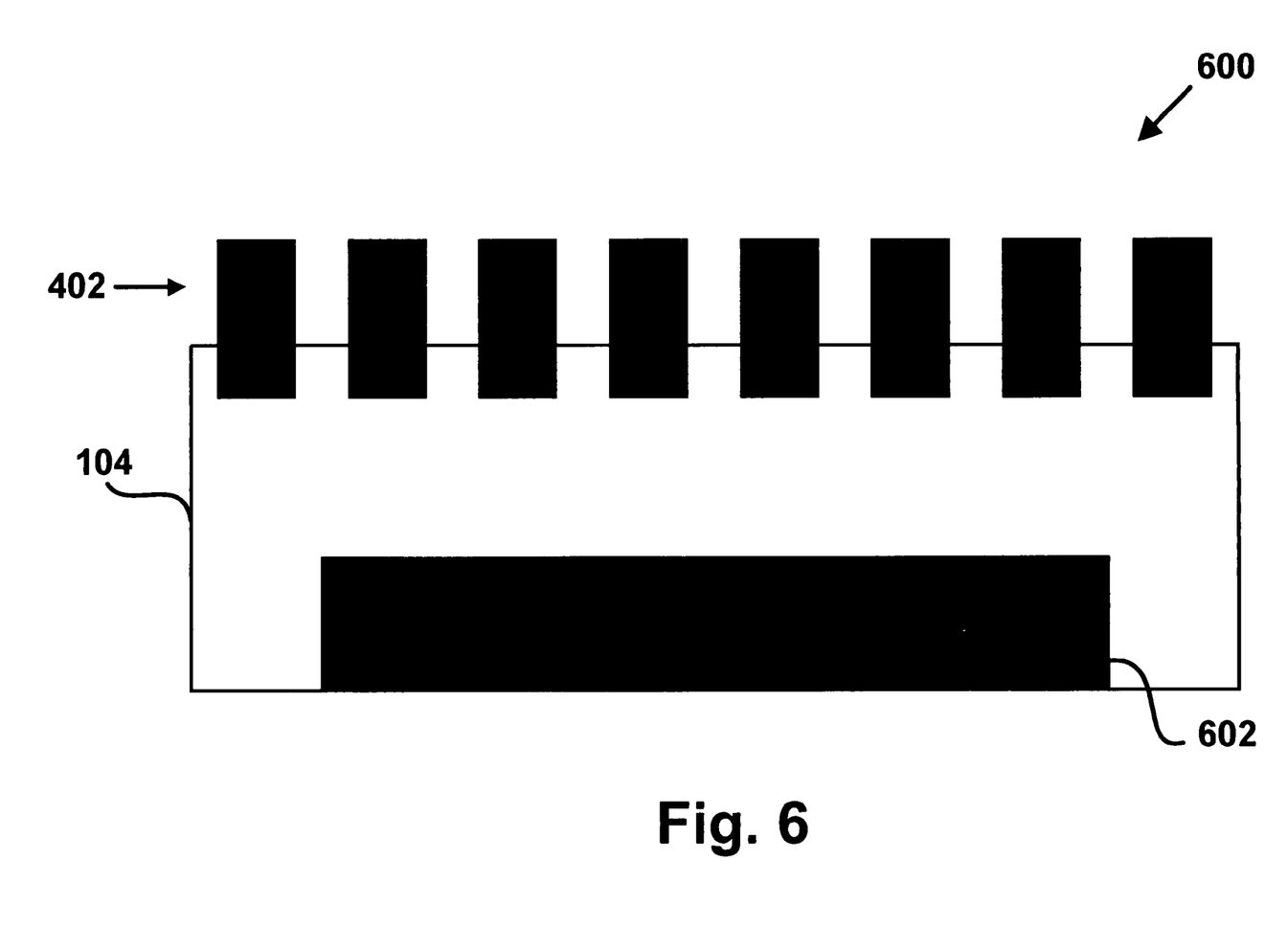
FIG. 6 is a land pattern for use in mounting the sensor package depicted in FIG. 1, according to another example.

FIG. 6 is a land pattern 600 for use in mounting the sensor package 100. The land pattern 600 may be provided on a next assembly to which the sensor package 100 is to be mounted. The land pattern 600 includes the single row of pads 502 for making electrical and/or mechanical connections to the sensor package 100. The land pattern 600 also includes a leveling bar 602. The leveling bar 602 may be used to position the sensor package 100 square to the PCB or other assembly during mounting of the sensor package 100 to the next assembly. As a result, the sensor package 100 may be mounted in a manner to keep the sensor's axis perpendicular to the PCB. The leveling bar 602 does not need solder paste as the leveling bar 602 is not used for making electrical contact.

It should be understood that the illustrated embodiments are examples only and should not be taken as limiting the scope of the present invention. For instance, the examples described herein to reduce the package height of a magnetic sensor may be used to reduce the height of other electronic circuit packages. The claims should not be read as limited to the described order or elements unless stated to that effect. Therefore, all embodiments that come within the scope and spirit of the following claims and equivalents thereto are claimed as the invention.

We claim:

1. A circuit package for minimizing height, comprising in combination:
   a die having a plurality of connection pads, wherein all of the connection pads are arranged to form a first vertical array and a second vertical array;
      wherein the first vertical array comprises at least a first bottom connection pad and a first top connection pad;
      wherein the second vertical array comprises at least a second bottom connection pad and a second top connection pad; and
      wherein the first vertical array of connection pads is located on an opposing side of the die from the second vertical array of connection pads; and
   a substrate, wherein the die is mounted on the substrate so that the first and second vertical arrays of connection pads are positioned to be substantially parallel to a side of the substrate that defines a height of the circuit package with respect to a mounting surface of the circuit package;
   wherein the first vertical array and the second vertical array define a vertical region with respect to the substrate, wherein the vertical region is an area on the substrate between a lower boundary bounded by a line that is substantially perpendicular to the first and second vertical arrays and passes through a bottom of the lowest of either the first bottom connection pad and the second bottom connection pad and with an upper boundary bounded by a line that is substantially perpendicular to the first and second vertical arrays and passes through a top of the highest of either the first top connection pad and the second top connection pad; and
   wherein the connection pads are electrically connected to a plurality of wire bond pads all of which are located on the substrate within the vertical region, wherein the wire bond pads are electrically connected to circuit package pads all of which are located on a single side of the circuit package.

2. The circuit package of claim 1, wherein the die is a magnetic sensor die.

3. The circuit package of claim 1, wherein the connection pads are confined within an active region of the die.

4. The circuit package of claim 1, wherein the first and second vertical arrays of connection pads are connected to wire bond pads on the substrate with bonding wire.

5. The circuit package of claim 4, wherein the wire bond pads are arranged to form two vertical arrays, wherein a first vertical array of wire bond pads is located on a portion of the substrate adjacent to a side of the die containing the first vertical array of connection pads, and wherein a second vertical array of wire bond pads is located on a portion of the substrate adjacent to a side of the die containing the second vertical array of connection pads.

6. The circuit package of claim 5, wherein the first vertical array of wire bond pads is located on the substrate to be substantially parallel with the first vertical array of connection pads, and wherein the second vertical array of wire bond pads is located on the substrate to be substantially parallel with the second vertical array of connection pads.

7. The circuit package of claim 4, wherein the wire bond pads are connected by traces to vias.

8. The circuit package of claim 7, wherein the vias are connected by traces to circuit package pads.

9. The circuit package of claim 1, wherein the first and second vertical arrays of connection pads are connected to solderable chip pads on the substrate using flip chip bonding.

10. The circuit package of claim 9, wherein the solderable chip pads are connected by traces to vias.

11. The circuit package of claim 10, wherein the vias are connected by traces to circuit package pads.

12. The circuit package of claim 11, wherein the circuit package pads are located on a single side of the circuit package.

13. A land pattern located on an assembly to which a circuit package is to be mounted, comprising in combination:

at least one leveling pad at a first side of a substrate for positioning the circuit package perpendicular with respect to the assembly;

wherein the circuit package comprises a sensor die mounted on a substrate and encapsulated by a mold; and     wherein the sensor die has a plurality of connection pads, wherein all of the connection pads are arranged to form a first vertical array and a second vertical array;

wherein the first vertical array comprises at least a first bottom connection pad and a first top connection pad;

wherein the second vertical array comprises at least a second bottom connection pad and a second top connection pad; and         wherein the first vertical array of connection pads is located on an opposing side of the die from the second vertical array of connection pads; and     wherein the sensor die is mounted on the substrate so that the first and second vertical arrays of connection pads are positioned to be substantially parallel to a side of the substrate that defines a height of the circuit package with respect to a mounting surface of the circuit package;

wherein the first vertical array and the second vertical array define a vertical region with respect to the substrate, wherein the vertical region is an area on the substrate between a lower boundary bounded by a line that is substantially perpendicular to the first and second vertical arrays and passes through a bottom of the lowest of either the first bottom connection pad and the second bottom connection pad and with an upper boundary bounded by a line that is substantially perpendicular to the first and second vertical arrays and passes through a top of the highest of either the first top connection pad and the second top connection pad; and     wherein the connection pads are electrically connected to a plurality of wire bond pads all of which are located on the substrate within the vertical region, wherein the wire bond pads are electrically connected to circuit package pads all of which are located on a single side of the circuit package; and a single row of pads at a second side of the substrate opposite the first side of the substrate for making connections to one side of the circuit package.

* * * * *